(12) United States Patent
Phillips et al.

(10) Patent No.: US 9,903,899 B2
(45) Date of Patent: Feb. 27, 2018

(54) LEAKAGE CURRENT SENSOR FOR POST TYPE INSULATOR

(71) Applicant: Electric Power Research Institute, Inc., Charlotte, NC (US)

(72) Inventors: Andrew John Phillips, Harrisburg, NC (US); Christiaan Stephan Engelbrecht, Ede (NL); J. Mark Major, San Antonio, TX (US); Robert Carlton Lynch, Fuquay-Varina, NC (US)

(73) Assignee: ELECTRIC POWER RESEARCH INSTITUTE, INC., Charlotte, NC (US)

( * ) Notice: Subject to any disclaimer, the term of this patent is extended or adjusted under 35 U.S.C. 154(b) by 0 days.

(21) Appl. No.: 13/728,484

(22) Filed: Dec. 27, 2012

(65) Prior Publication Data
US 2013/0169286 A1 Jul. 4, 2013

Related U.S. Application Data

(60) Provisional application No. 61/580,810, filed on Dec. 28, 2011.

(51) Int. Cl.
*G01R 31/14* (2006.01)
*G01R 31/02* (2006.01)
(Continued)

(52) U.S. Cl.
CPC ............ *G01R 31/02* (2013.01); *G01R 15/14* (2013.01); *G01R 31/1245* (2013.01); *G01R 19/2513* (2013.01); *G01R 31/025* (2013.01)

(58) Field of Classification Search
CPC .... G01R 31/02; G01R 15/14; G01R 31/1245; G01R 31/025
(Continued)

(56) References Cited

U.S. PATENT DOCUMENTS

| 4,728,887 A | 3/1988 | Davis |
| 5,610,512 A | 3/1997 | Selcuk |

(Continued)

FOREIGN PATENT DOCUMENTS

| EP | 2006699 | 12/2008 |
| JP | 0062278465 | 12/1987 |

(Continued)

OTHER PUBLICATIONS

Sorqvist, Outdoor polymeric insulators long-term exposed to HVDC, IEEE Trans. on Power Delivery, V. 12, No. 2, Apr. 1997, p. 1041-1048.*

(Continued)

*Primary Examiner* — Patrick Assouad
*Assistant Examiner* — Demetrius Pretlow
(74) *Attorney, Agent, or Firm* — Trego, Hines & Landenheim, PLLC; Brandon Trego; Jonathan Hines

(57) ABSTRACT

A sensor apparatus for detecting leakage current in a post-type insulator of an electrical power system includes: a sensor unit having a housing, the sensor unit including: a sensor assembly operable to generate an analog signal proportional to a received leakage current; an electronics module operable to covert the analog signal to a digital value; and a communications system operable to wirelessly transmit the digital value to an external receiver; a collection band adapted to be connected to an exterior surface of the insulator; and a transfer lead interconnecting the sensor assembly and the collection band, the transfer lead operable to transfer leakage current from the insulator from the collection band to the sensor assembly.

11 Claims, 6 Drawing Sheets

(51) Int. Cl.
*G01R 15/14* (2006.01)
*G01R 31/12* (2006.01)
*G01R 19/25* (2006.01)

(58) Field of Classification Search
USPC .......................................... 324/509, 126–127
See application file for complete search history.

(56) References Cited

U.S. PATENT DOCUMENTS

| | | | |
|---|---|---|---|
| 5,764,065 | A | 6/1998 | Richards et al. |
| 6,205,867 | B1 | 3/2001 | Hayes et al. |
| 6,523,424 | B1 | 2/2003 | Hayes et al. |
| 6,633,169 | B1 | 10/2003 | Cavigelli |
| 6,788,426 | B1 | 9/2004 | Sharp et al. |
| 7,002,331 | B2 | 2/2006 | Sae-Ueng et al. |
| 7,067,829 | B2 | 6/2006 | Richards et al. |
| 7,369,045 | B2 | 5/2008 | Hansen |
| 7,421,258 | B2 | 9/2008 | Bauschke et al. |
| 7,486,084 | B2 | 2/2009 | Phillips et al. |
| 7,494,271 | B2 | 2/2009 | Scholtz et al. |
| 7,615,132 | B2 | 11/2009 | Yasui et al. |
| 7,620,517 | B2 | 11/2009 | Scholtz et al. |
| 7,641,387 | B2 | 1/2010 | Engelhardt et al. |
| 7,748,269 | B2 | 6/2010 | Shenzhen |
| 7,808,250 | B2 | 10/2010 | Honda et al. |
| 2009/0243876 | A1 | 10/2009 | Lilien et al. |
| 2010/0100239 | A1 | 4/2010 | Park et al. |
| 2011/0101989 | A1 | 5/2011 | Hyde et al. |
| 2011/0279278 | A1 | 11/2011 | Al-Absi et al. |
| 2012/0092115 | A1* | 4/2012 | Srinivasrao et al. ......... 336/170 |

FOREIGN PATENT DOCUMENTS

| | | |
|---|---|---|
| JP | 2000131258 | 9/2004 |
| RU | 2212678 | 9/2003 |
| RU | 2233754 | 8/2004 |
| RU | 89792 | 12/2009 |
| SU | 724338 | 3/1980 |
| SU | 1305031 | 4/1987 |
| SU | 1642530 | 4/1991 |
| WO | 2007093861 | 8/2007 |

OTHER PUBLICATIONS

MetersUSA, Current Transformers Principles of Operation, p. 1-4, no date, www.metersUSA.com.*
Vishay, Resistors—Linear—Current Sensing, p. 1-4, 2014.*
Meder, How reed switches are used with a permanent magnet, p. 28-34, www.digikey.com, no date.*
ASEA, Earth-fault protective relays with open-core current transformers, p. 1-12, Ed. 2, Feb. 1976.*
Kurihara, Construction of remote monitoring system for separate measurement of leakage current of outdoor insulators, p. 401-404, Jun. 1-5, 2003, Proc. of 7th Inter. Conf. on Properties and Apps. of Dielectric Materials, Nagaya, Japan.*
Pylariinos, Impact of noise related waveforms on long term field leakage current measurements, IEEE Trans on Dielectrics and Electrical Insulation, V. 18, No. 1, Feb. 2011, p. 122-129.*
OSKF, Current Transformers, p. 1-4, Alstom, no date.*
Flex-Core, Current Transformers, Model FC, p. 6-7, www.flex-core.com, no date.*
Schweber, Bill, "Peak Detector: A Classic Analog Circuit Still in Wide Use", Planet Analog, Dec. 5, 2013, p. 1-5.*
A. Semenova, WIPO International Search Report for PCT/US2012/051699, dated Nov. 9, 2012, Russia.
Y. Usikova, WIPO International Search Report for PCT/US2012/051695, dated Nov. 21, 2012, Russia.
O. Schedrina, WIPO International Search Report for PCT/US2012/072012, dated Mar. 13, 2013, Russia.
O. Schedrina, WIPO International Search Report for PCT/US2012/072023, dated Mar. 21, 2013, Russia.
Nadal, Rafael, Supplementary European Search Report for EP12863720, dated Sep. 23, 2015, EPO, Munich.

* cited by examiner

LEAKAGE CURRENT SENSOR FOR POST TYPE INSULATOR

BACKGROUND OF THE INVENTION

The present invention relates generally to the monitoring of leakage currents in an electrical power transmission system and, more particularly, to a sensor for accurately detecting and monitoring leakage current in post-type insulators.

In many countries, including the United States, wood is utilized as part of line insulation in electrical power transmission systems to improve the basic insulation level ("BIL") of the line, as it has been recognized that the lighting performance of transmission lines can be improved by utilizing the wood support or pole. This has not been without problems as there were, and still are, many instances of fires of the wood poles and cross arms caused by low frequency leakage current and sparking on the wood from sources such as leakage current due to insulator contamination, despite mitigation measures being taken.

Insulators installed on electrical power transmission and distribution systems are exposed to contamination, for example from marine salt, road salt, and industrial pollutants. This contamination can result in flashover of the insulator, usually under light wetting conditions, e.g. condensation, when the salts and water mix to become a conductive electrolyte. Flashover is a problem in that it results in an outage which interrupts power to utility customers.

When the salts on the surfaces of an insulator become wet they form an electrolyte which is conductive. Since the one end of the insulator is energized, and the other end is grounded, leakage currents flow along the insulator surfaces. If these currents are large enough arcing will occur (called dry band arcing), this arcing will either extinguish or grow to result in a flashover. The magnitude of the leakage currents that occur under the dry band arcing conditions provide an indication of the risk of the insulator flashing over. If insulators are at risk of flashover due to contamination build-up, utilities can wash the insulators or take other measures such as redirecting power to other transmission and distribution assets.

In addition when composite (also called polymer or non-ceramic) or coated insulators are used the leakage currents and arcing on the surface can degrade the rubber material used therein.

Accordingly, there is a need for a leakage current monitoring system that continuously monitors and reports potential leakage current issues to allow an action to be taken to mitigate any potential problems that may arise from the leakage current.

BRIEF SUMMARY OF THE INVENTION

The above-mentioned need is addressed by the present invention, which provides a sensor unit that can be mounted in close proximity to a post-type insulator. The sensor unit detects leakage current and wirelessly transmits the leakage current values to an external receiver. The sensor unit can assign the leakage current value to a bin representing of the magnitude of the leakage current.

According to one aspect of the invention, a sensor apparatus is provided for detecting leakage current in a post-type insulator of an electrical power system. The apparatus includes: a sensor unit having a housing, the sensor unit including: a sensor assembly operable to generate an analog signal proportional to a received leakage current; an electronics module operable to covert the analog signal to a digital value; and a communications system operable to wirelessly transmit the digital value to an external receiver; a collection band adapted to be connected to an exterior surface of the insulator; and a transfer lead interconnecting the sensor assembly and the collection band, the transfer lead operable to transfer leakage current from the insulator from the collection band to the sensor assembly.

According to another aspect of the invention, a is provided method of detecting leakage current in a post-type insulator of an electrical power system, the method includes: conducting a leakage current from the insulator through a transfer lead to a sensor unit mounted in close proximity to the insulator, the sensor unit having a housing; using a sensor assembly of the sensor unit, generating an analog signal proportional to the leakage current; using an electronics module of the sensor unit, converting the analog signal to a digital value; and using a communications system of the sensor unit, wirelessly transmitting the digital value to an external receiver.

BRIEF DESCRIPTION OF THE DRAWINGS

The subject matter that is regarded as the invention may be best understood by reference to the following description taken in conjunction with the accompanying drawing figures in which.

DETAILED DESCRIPTION OF THE INVENTION

Figure 1:
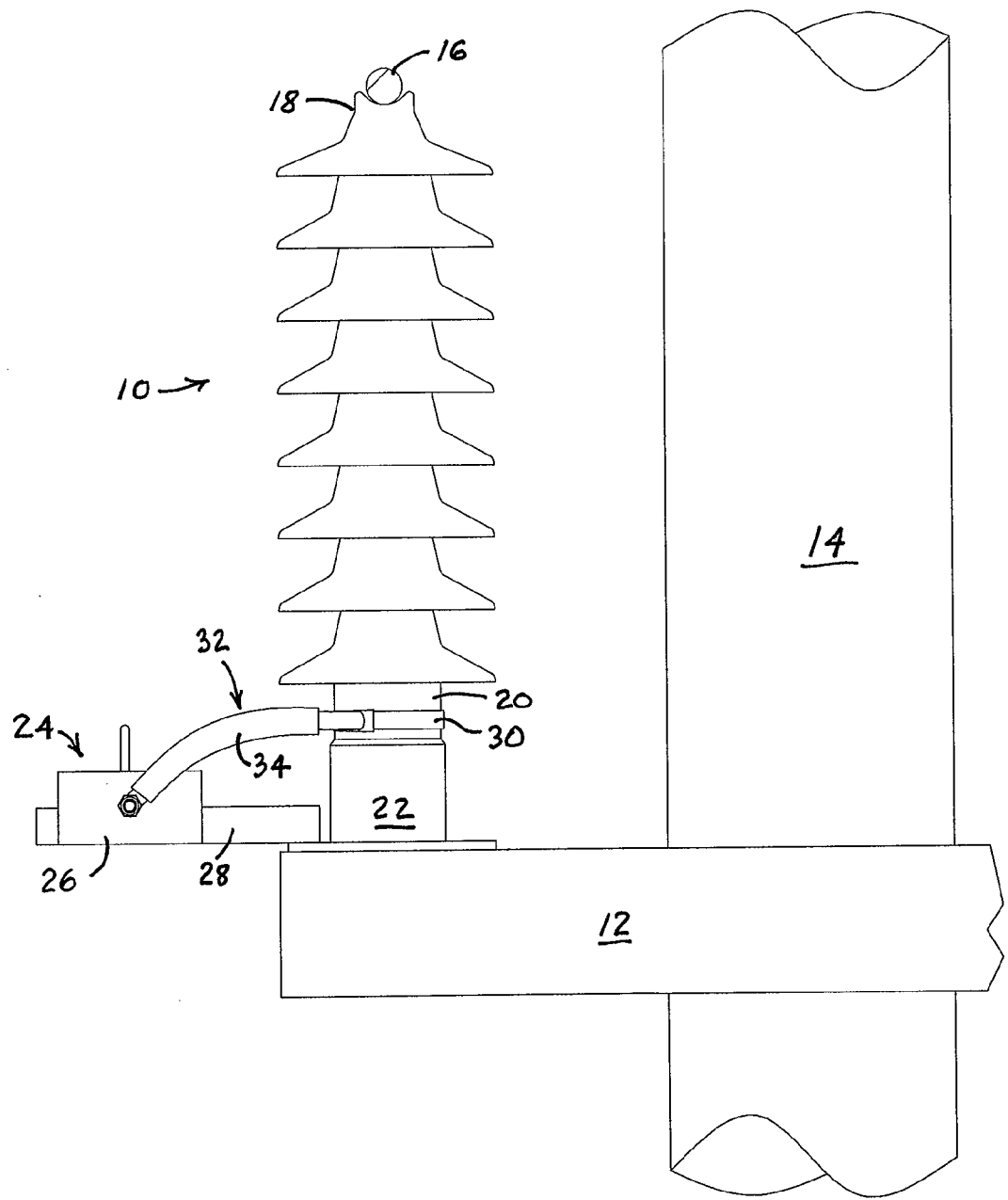
FIG. 1 is a schematic side view of a portion of a utility pole carrying a post-type insulator and a sensor unit constructed according to an aspect of the present invention.

Referring now to the drawings in detail, wherein identical numerals indicate the same elements throughout the figures, FIG. 1 schematically depicts an insulator 10 which is carried on a cross-arm 12 of a utility pole 14 and which supports an electric power line 16. The insulator 10 is a known post-type insulator having a generally cylindrical exterior shape with an upper end 18 and a lower or grounded end 20, and is made from an electrically insulating (i.e. non-electrically-conductive) material. In the illustrated example, the lower end 20 of the insulator 10 is mounted to the cross-arm 12 by a bracket 22. A sensor unit 24 is also mounted to the cross-arm 12.

The sensor unit 24 includes a metal housing 26 which encloses the functional components (described in more detail below) and protects them from electromagnetic influences. The housing 26 is positioned in close proximity to the insulator 10 and is electrically grounded or earthed, i.e. connected to a structure at electrical ground potential.

For example, the housing 26 may be attached to the grounded end of the insulator 10, or the metal structure to which the insulator 10 is attached. In the illustrated example the housing 26 is mounted to the bracket 22 of the cross-arm 12 using a mounting bracket 28 having an L-shaped cross section.

A leakage current collection band 30, made from metal or other conductive material, is installed around the shank of the insulator 10 close to the grounded end 20, but not electrically in contact with the grounded end 20. In the illustrated example, the collection band 30 is fabricated from a braided metallic strap. Optionally, in order to ensure that the collection band 30 is not electrically in contact with the grounded end 20, an insulating band of non-conductive material (not shown) can be installed between the collection band 30 and the grounded end 20 of the insulator 10. The purpose of the collection band 30 is to intercept currents that are flowing on the surface of the insulator 10 and divert them to the sensor unit 24. An insulated transfer lead 32 connects the collection band to the sensor unit 24. In the illustrated example a portion of the collection band 30 is covered with insulation 34 and also serves the function of the transfer lead 32.

Figure 2:
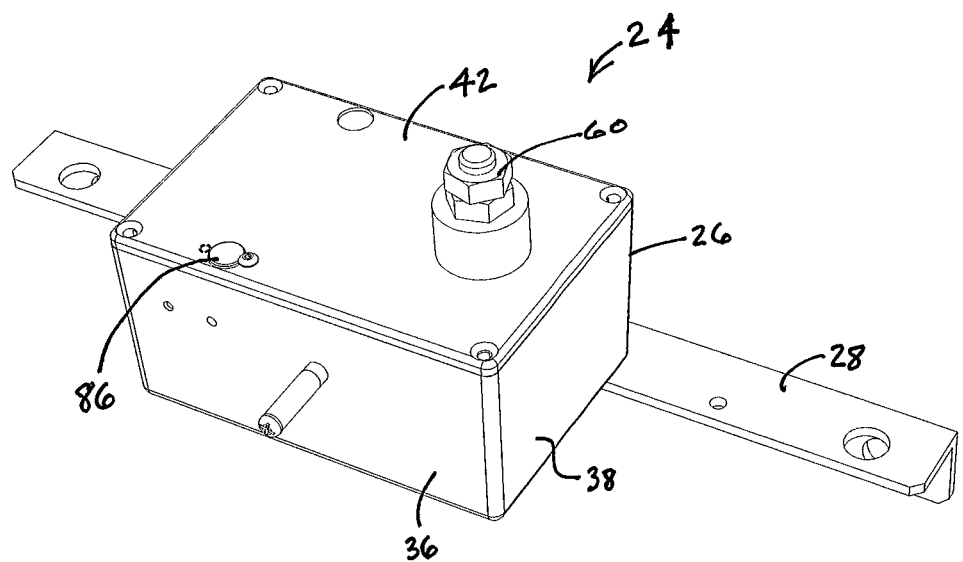
FIG. 2. is a perspective view of the sensor unit shown in FIG. 1.
Figure 3:
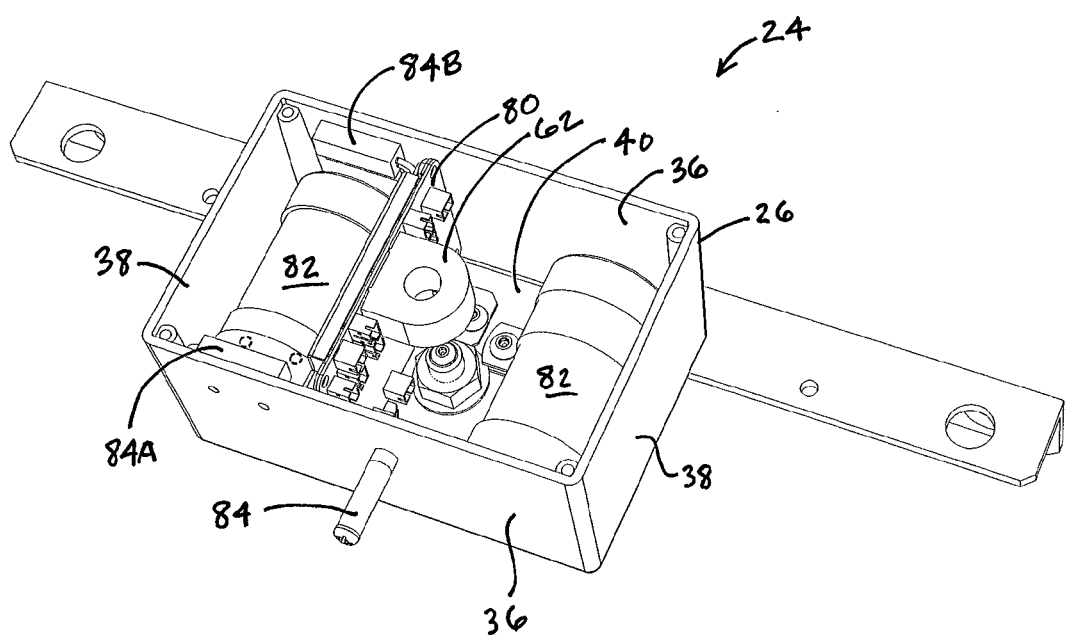
FIG. 3 is a view of the sensor unit shown in FIG. 2 with a cover removed to show the internal components.

The sensor unit 24 is shown in more detail in FIGS. 2 and 3. The housing 26 is generally rectangular and includes two spaced-apart sidewalls 36, two spaced-apart endwalls 38, a bottom wall 40, and a top wall 42. When used herein, the directional terms "top", "bottom", "side", etc. are merely for reference and do not imply that any specific orientation of the sensor unit 24 is required.

Figure 4:
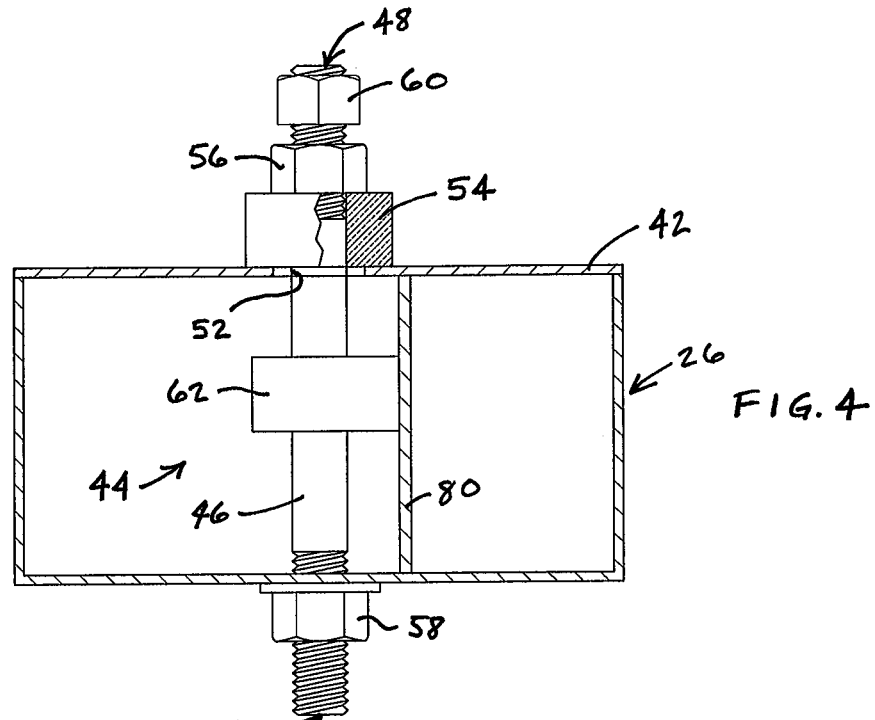
FIG. 4 is a partially-sectioned view of a sensor unit showing a first configuration of a sensor assembly therein.

A sensor assembly is mounted in the housing 26. The configuration of the sensor assembly may be varied to suit a particular application. In the example shown in FIG. 4, the sensor assembly 44 includes a bolt 46 extending completely through the housing 26 and having upper and lower ends 48 and 50. The upper end 48 of the bolt 46 passes through a clearance hole 52 in the top wall 42 and is received in an insulator 54. The lower end 50 of the bolt 46 passes through a hole in the bottom wall 40. The bolt 46 is secured in place by upper and lower clamp nuts 56 and 58, respectively. When assembled, the upper end 48 of the bolt 46 is not electrically connected to the housing 26 and the lower end 50 is electrically connected to the housing 26. A binding nut 60 is provided at the upper end 48 to secure the transfer lead 32 to the bolt 46.

The bolt 46 passes through the interior opening of a toroidal current transformer 62 of a known type. The current transformer 62 functions as a sensor providing a voltage output which is proportional to the leakage current flowing in the bolt 46. The frequency response of available current transformers is from less than 10 Hz to greater than 100 kHz. Preferably, the current transformer 62 is a ferrous current transformer with a straight current conductor as primary winding. The saturation characteristics of the magnetic circuit and low impedance of the primary winding protects the internal electronics of the sensor unit 24 from overvoltages.

Figure 5:
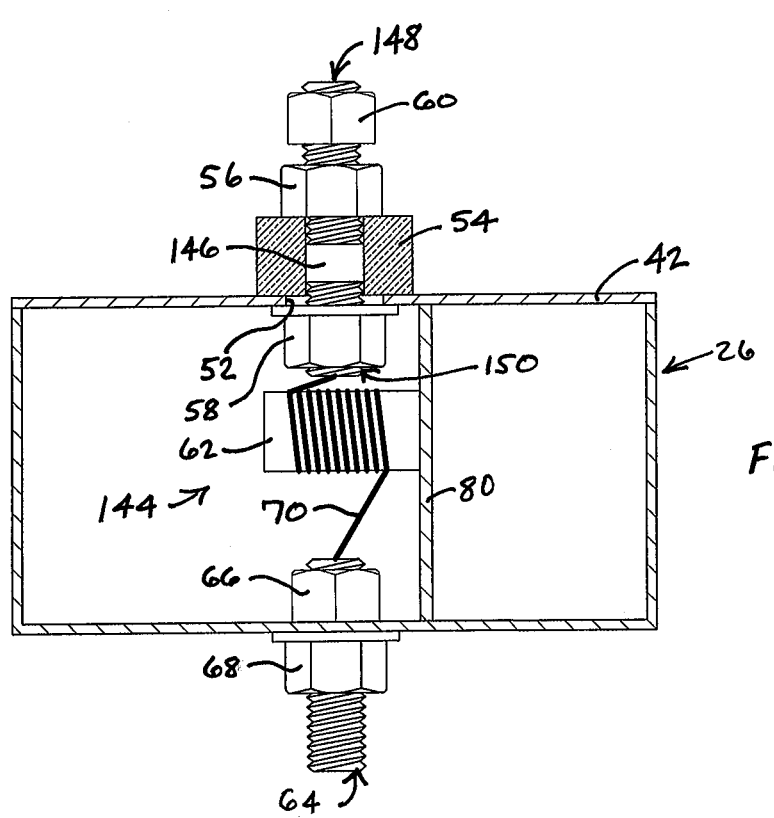
FIG. 5 is a partially-sectioned view of a sensor unit showing a second configuration of a sensor assembly therein.

FIG. 5 shows an example of another sensor configuration. The sensor assembly 144 includes a bolt 146 having upper and lower ends 148 and 150. The upper end 148 of the bolt 146 passes through a clearance hole 52 in the top wall 42 of the housing 26 and is received in an insulator 54. The lower end 150 of the bolt 146 protrudes a short distance through the top wall 42. The bolt 146 is secured in place by upper and lower clamp nuts 56 and 58, respectively. When assembled, the upper end 148 of the bolt 146 is not electrically connected to the housing 26. A binding nut 60 is provided at the upper end 148 to secure the transfer lead 32 to the bolt 146.

A ground post 64 is also provided which passes through the bottom wall 40 and is secured in place by upper and lower clamp nuts 66 and 68, respectively. When assembled, the ground post 64 is electrically connected to the housing 26.

A toroidal current transformer 62 of a known type, like the one described above, is positioned inside the housing 26 below the lower end 150 of the bolt 146. A ground lead 70 is connected to the lower end 150 of the bolt 146, passes through or near the current transformer 62 and then connects to the ground post 64. In order to increase the gain of the current transformer 62, the ground lead 70 may be wrapped around the current transformer 62 one or more times, as shown. This may be useful, for example, to increase the sensitivity of the sensor unit 24 when investigating wood pole fires caused by contamination.

Figure 6:
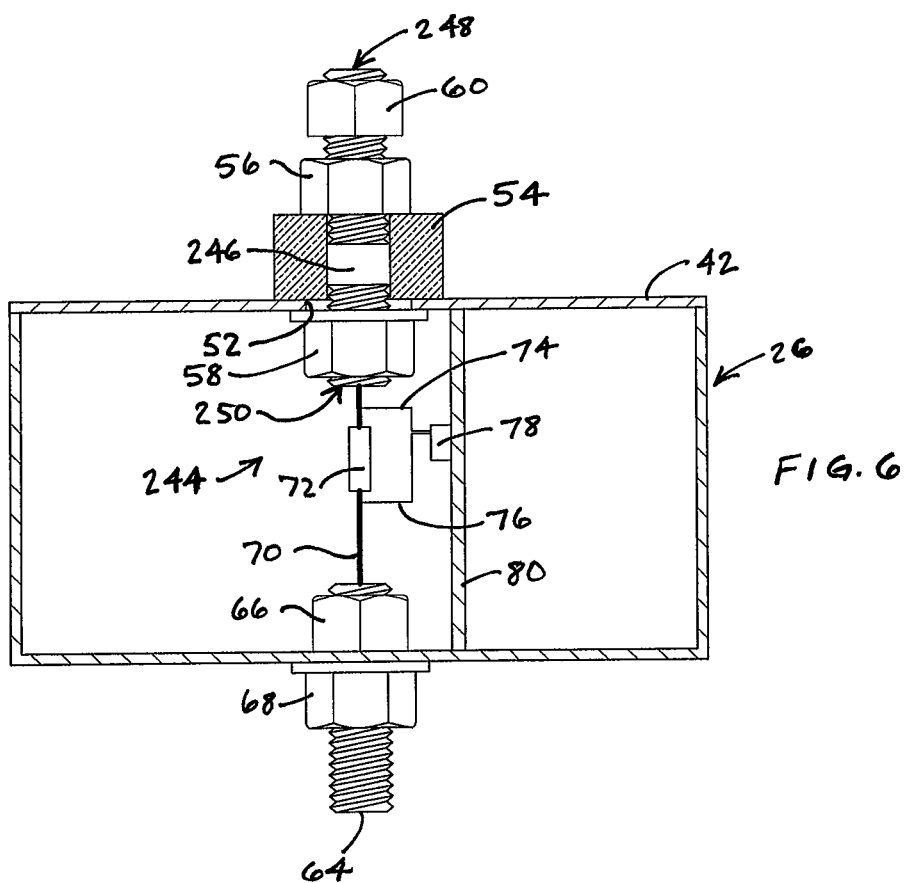
FIG. 6 is a partially-sectioned view of a sensor unit showing a third configuration of a sensor assembly therein.

FIG. 6 shows an example of yet another sensor configuration. The sensor assembly 244 includes a bolt 246 having upper and lower ends 248 and 250. The upper end 248 of the bolt 246 passes through a clearance hole 52 in the top wall 42 of the housing 26 and is received in an insulator 54. The lower end 250 of the bolt 246 protrudes a short distance through the top wall 42. The bolt 246 is secured in place by upper and lower clamp nuts 56 and 58, respectively. When assembled, the upper end 248 of the bolt 246 is not electrically connected to the housing 26. A binding nut 60 is provided at the upper end 248 to secure the transfer lead 32 to the bolt 246.

A ground post 64 is also provided which passes through the bottom wall 40 and is secured in place by upper and lower clamp nuts 66 and 68, respectively. When assembled, the ground post 64 is electrically connected to the housing 26.

A ground lead 70 is connected between the lower end 250 of the bolt 246 and the ground post 64. A resistor 72 having a known resistance is connected in-line with the ground lead 70. Lines 74 and 76 from a voltage transducer 78 are connected to the ground lead 70 upstream and downstream of the resistor 72, respectively, such that the voltage transducer 78 can measure the voltage drop across the resistor. From this, the current flowing through the resistor may be computed from Ohm's Law as I=V/R, where I is current, V is voltage, and R is resistance The sensor assembly (like the sensor assemblies 44, 144, or 244 described above) is operably connected to a electronics module 80 which functions to receive, process, and store signals from the sensor assembly, to receive external commands, and to transmit data to an external source. The electronics module 80 may include, for example, a printed circuit board incorporating analog, digital and/or radio-frequency ("RF") electronic components. The electronics module 80 may incorporate discrete components and/or one or more microprocessors. the components of the electronics module 80 may embedded in potting compound to protect them environmental influences.

In addition to the electronics module, the housing includes an electric power source for the electronics module 80, such as the illustrated batteries 82 (see FIG. 3). The housing 26 also includes one or more RF antennas 84 which protrude from the exterior of the housing 26 and are used to transmit signals generated by the electronics module 80 to a remote receiver (not shown), and/or to receive RF signals from a remote receiver (not shown). The sensor unit 24 incorporates a communication system that may be based on the IEEE 805.15.4 architecture. The communication protocol allows two-way communications.

In the illustrated example, magnetically-operated switches are mounted inside the housing 26 and coupled to the electronics module 80. The switches can be tripped by placing a magnet 86 the near vicinity of the switch on the outside of the housing 26. In the illustrated example, the sensor unit 24 includes a power switch 84A which toggles the sensor unit 24 between the on and off state, and a reset switch 84B which signals the sensor unit 24 to erase any stored data.

The electronics module 80 may include a temperature sensor (not separately illustrated) in order to assist in assessing condensation conditions. The electronics module 80 may also include a 3D accelerometer (not separately illustrated), in order to assess whether the insulator or structure is experiencing vibration issues.

Figure 7:
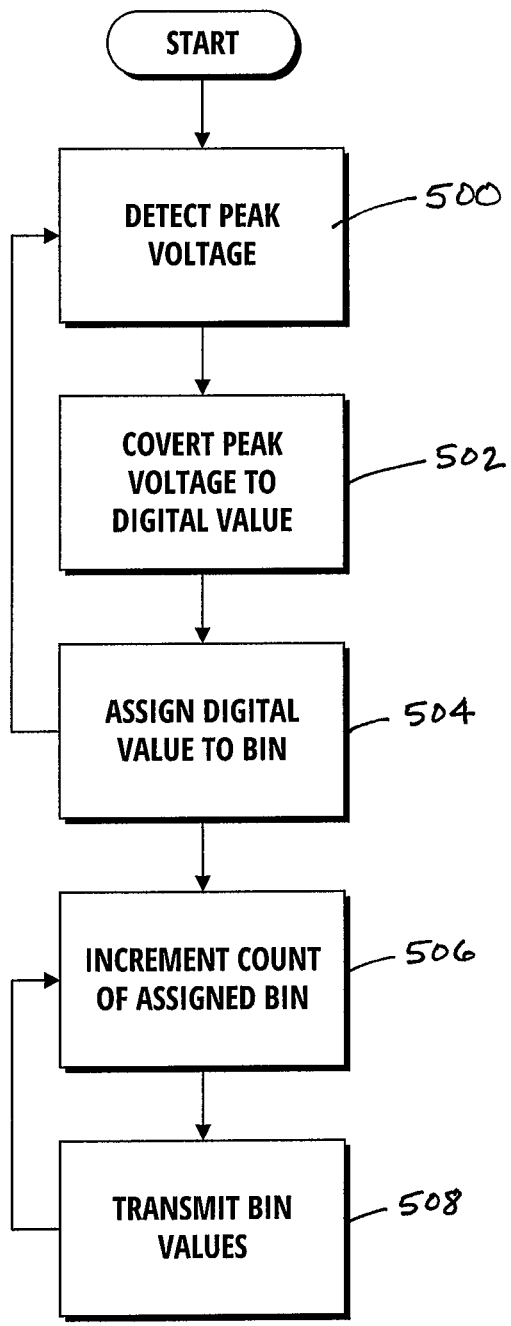
FIG. 7 is a block diagram showing the operation of a sensor unit.

The operation of the electronics module 80 and the sensor assembly will now be described with reference to the block diagram in FIG. 7. In block 500, the electronics module 80 uses a peak detect circuit of a known type to measure and hold a voltage signal from the sensor assembly described above. The voltage signal is proportional to the highest leakage current measured in a predetermined first time interval, e.g. 60 seconds. This peak detect circuit is reset at the first interval, e.g. 60 seconds, based on a digital signal from the microprocessor. At block 502, an Analog to Digital (ND) converter (which may be part of a microprocessor of the electronics module 80) measures the value from the peak detect circuit, repeating as the first interval. At block 504, the microprocessor evaluates the digital value and assigns the value to membership in a category or "bin". The bin represents a range in which the measured value lies. For example, there may be six numbered bins which account for different leakage current magnitudes. Examples of two different settings for the leakage current threshold for the bins are listed in Table 1 below, in which "regular" indicates a classification that is relatively less sensitive to leakage currents and "sensitive" indicates a classification that is relatively more sensitive to leakage currents.

TABLE 1

| BIN NUMBER | CURRENT RANGE, REGULAR (PEAK mA) | CURRENT RANGE, SENSITIVE (PEAK mA) |
| --- | --- | --- |
| 1 | 0-10 | 0-1 |
| 2 | 10-20 | 1-2 |
| 3 | 20-50 | 2-5 |
| 4 | 50-200 | 5-20 |
| 5 | 200-500 | 20-50 |
| 6 | 500+ | 50+ |

The electronics module 80 maintains a counter for each of the bins. When the digital value is assigned to a bin, the counter for that bin is incremented (see block 506). At block 508, the number of counts in each bin is then transmitted using RF to a remote receiver. The transmission repeats at a second interval which is preferably shorter than the first interval described above.

The sensor unit 24 only stores the statistical parameters (i.e. the bin counts) of the leakage current peaks that occur. No other leakage current parameters need be recorded. Using the communications system described above, a remote user can reset the bins or change the ranges of the bins remotely.

The sensor unit 24 also keeps track of the time since the last reset. This limits the data message sent by the device to the bare minimum. It also limits the internal circuit complexity and power consumption for the device. Based on the battery characteristic and low power consumption of the sensor unit 24, battery life is estimated at more than 10 years.

The sensor units 24 can be employed in different modes. For example, when installed on transmission lines the sensor units 24 may be polled a only few times per year when line maintenance crews do inspections or maintenance, for example using handheld receivers (not shown).

Alternatively, in substations or on specific transmission line structures a more sophisticated approach may be followed. A dedicated base station system (not shown) installed at the substation/structure would poll the nearby sensor units 24 at a short time interval. This base station stores leakage current data together with weather parameters from attached sensors. The data is then transmitted from the base station using a variety of methods including the use of GPRS modems or connecting to a utility data management system. The data is stored and processed on a remote server. Alarms can be generated based on algorithms and data can be viewed using visualization tools.

If the leakage current characteristics of the insulators are known, alarms can be generated automatically based on preset leakage current alarm levels. Warnings or alarms can be raised to initiate insulator maintenance (e.g. washing) if certain pre-set leakage current thresholds are exceeded. Leakage current information can also be used select appropriate mitigation measures.

It should be noted that the sensor units 24 are connected between the insulator and the grounding system. With this configuration the insulator leakage current is directly shunted to ground and it will therefore not pass through the wood cross arm. The leakage currents measured can however be used to raise warnings that conditions and insulator contamination levels are sufficiently high to cause wood pole fires.

The sensor unit 24 described above has several advantages. The sensor units 24 are suitable for wide spread deployment which makes them practical for installations on overhead lines and substations. Some of the specific advantages of the sensor are low cost; absence of wiring to either power the sensor unit 24 or communicate with the sensor 24, leading to improved reliability compared to wired units; the ability to quickly deploy many sensor units 24; on-board processing of data, providing a user with processed information on which he can make a decision; and a combination of analog and digital electronics, ensuring that no current pulses are ever missed, as compared to previous technologies that used digital measurement only.

The foregoing has described a sensor apparatus for detecting and monitoring leakage current in post-type insulators. While specific embodiments of the present invention have been described, it will be apparent to those skilled in the art that various modifications thereto can be made without departing from the spirit and scope of the invention. Accordingly, the foregoing description of the preferred embodiment of the invention and the best mode for practicing the invention are provided for the purpose of illustration only and not for the purpose of limitation.

What is claimed is:

1. A method of detecting leakage current in a post-type insulator of an electrical power system, the method comprising:

conducting a leakage current from the insulator through a transfer lead to a sensor unit mounted in close proximity to the insulator, using a sensor assembly of the sensor unit, generating an analog signal proportional to the leakage current;

using an analog peak detector circuit of an electronics module of the sensor unit to detect a scalar peak value of the analog signal occurring during a predetermined first time interval;

using an analog to digital converter of the electronics module of the sensor unit, converting the scalar peak value of the analog signal from the analog circuit to a digital value; and using the electronics module to assign the digital value to one of a plurality of bins based on the magnitude of the digital value, wherein each of the plurality of bins represents a predetermined range of magnitudes of leakage current.

2. The method of claim 1 further comprising incrementing a bin count of the assigned bin each time a digital value is assigned to the assigned bin.

3. The method of claim 2 further comprising using a communications system of the sensor unit, wirelessly transmitting the bin counts to an external receiver.

4. The method of claim 3 further comprising:
wirelessly transmitting the bin counts to an external receiver at a predetermined second time interval.

5. The method of claim 4 wherein the second time interval is shorter than the first time interval.

6. The method of claim 2 further comprising:
at the end of the first time interval, resetting the analog peak detect circuit, and
repeating the steps of: conducting a leakage current; generating an analog signal;
detecting a scalar peak value of the analog signal; converting the scalar peak value of the analog signal from the analog circuit to a digital value; and assigning the digital value to one of the plurality of bins.

7. A method of detecting leakage current in an insulator of an electrical power system, the method comprising:
conducting a leakage current from the insulator to a sensor unit mounted in close proximity to the insulator; and
repeating in a cycle the following steps:
resetting an analog peak detector circuit;
using a sensor to generate an analog signal proportional to the leakage current;
using the analog peak detector circuit, detecting a scalar peak value of the analog signal;
at the end of a predetermined first time interval, converting the scalar peak value to a digital value; and
assigning the digital value to one of a plurality of bins based on the magnitude of the digital value, wherein each of the plurality of bins represents a predetermined range of magnitudes of leakage current.

8. The method of claim 7 further comprising incrementing a bin count of the assigned bin each time a digital value is assigned to the assigned bin.

9. The method of claim 8 further comprising:
wirelessly transmitting the bin count of each of the bins to an external receiver at a predetermined second time interval.

10. The method of claim 9 wherein the second time interval is shorter than the first time interval.

11. The method of claim 7 wherein the first time interval is 60 seconds.

* * * * *